United States Patent
Xie et al.

(10) Patent No.: US 10,109,722 B2
(45) Date of Patent: Oct. 23, 2018

(54) ETCH-RESISTANT SPACER FORMATION ON GATE STRUCTURE

(71) Applicant: GLOBALFOUNDRIES Inc., Grand Cayman (KY)

(72) Inventors: Ruilong Xie, Niskayuna, NY (US); Zhenxing Bi, Niskayuna, NY (US); Pietro Montanini, Guilderland, NY (US); Eric R. Miller, Schenectady, NY (US); Balasubramanian Pranatharthiharan, Watervliet, NY (US); Oleg Gluschenkov, Tannersville, NY (US); Ruqiang Bao, Niskayuna, NY (US); Kangguo Cheng, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/447,210

(22) Filed: Mar. 2, 2017

(65) Prior Publication Data
US 2018/0254331 A1    Sep. 6, 2018

(51) Int. Cl.
| | | |
|---|---|---|
| H01L 21/336 | (2006.01) | |
| H01L 29/66 | (2006.01) | |
| H01L 21/3105 | (2006.01) | |

(52) U.S. Cl.
CPC .... H01L 29/66795 (2013.01); H01L 21/3105 (2013.01); H01L 21/31053 (2013.01); H01L 29/6656 (2013.01)

(58) Field of Classification Search
CPC .......... H01L 29/66795; H01L 29/6656; H01L 21/31053; H01L 21/3105
See application file for complete search history.

(56) References Cited

U.S. PATENT DOCUMENTS

| | | |
|---|---|---|
| 6,784,552 B2 | 8/2004 | Nulty et al. |
| 7,928,571 B2 | 4/2011 | Chidambarrao et al. |
| (Continued) | | |

OTHER PUBLICATIONS

S.V.Nguyen, High-density plasma chemical vapor deposition of silicon-based dielectric films for integrated circuits, 1999, vol. 43, 1-8.*

*Primary Examiner* — Mohsen Ahmadi
*Assistant Examiner* — Wasiul Haider
(74) *Attorney, Agent, or Firm* — Yuanmin Cai; Hoffman Warnick LLC

(57) ABSTRACT

The disclosure relates to methods of forming etch-resistant spacers in an integrated circuit (IC) structure. Methods according to the disclosure can include: forming a mask on an upper surface of a gate structure positioned over a substrate; forming a spacer material on the substrate, the mask, and exposed sidewalls of the gate structure; forming a separation layer over the substrate and laterally abutting the spacer material to a predetermined height, such that an exposed portion of the spacer material is positioned above an upper surface of the separation layer and at least partially in contact with the mask; and implanting a dopant into the exposed portion of the spacer material to yield a dopant-implanted region within the spacer material, wherein the dopant-implanted region of the spacer material has a greater etch resistivity than a remainder of the spacer material.

16 Claims, 19 Drawing Sheets

(56) References Cited

U.S. PATENT DOCUMENTS

| | | | |
|---|---|---|---|
| 2011/0223752 A1* | 9/2011 | Hing | H01L 29/6653 438/585 |
| 2012/0264305 A1 | 10/2012 | Nakano | |
| 2013/0181265 A1* | 7/2013 | Grasshoff | H01L 21/76897 257/288 |
| 2015/0221676 A1* | 8/2015 | Holt | H01L 29/66795 257/347 |
| 2016/0379839 A1* | 12/2016 | Hsu | H01L 29/66545 257/401 |
| 2017/0186623 A1* | 6/2017 | Posseme | H01L 21/02057 |
| 2017/0207324 A1* | 7/2017 | Huang | H01L 29/66803 |
| 2018/0122710 A1* | 5/2018 | Cheng | H01L 21/82386 |

* cited by examiner

ETCH-RESISTANT SPACER FORMATION ON GATE STRUCTURE

BACKGROUND

Technical Field

The present disclosure relates to methods of forming etch-resistant spacers in integrated circuit (IC) structures, e.g., to prevent material deformation or erosion in subsequent processing of the structure. Embodiments of the present disclosure include methods of forming an etch-resistant spacer by implanting dopants into only targeted portions of a spacer, with remaining portions of the spacer being left intact.

Related Art

Each IC can be made up of billions of interconnected devices, such as transistors, resistors, capacitors, and diodes, located on one or more chips of semiconductor substrate material. The quality and viability of a product including an IC can be at least partially dependent on the techniques used for fabricating the IC and the structure of various components therein. Fabrication of an IC can include two phases: front-end-of-line processes (FEOL) and back-end-of-line processes (BEOL). FEOL generally includes fabrication processes performed on a wafer up to forming a first "metal level," i.e., a metal wire for connecting several semiconductor devices together. In the case of a transistor, a group of vertically-extending conductive contacts can provide electrical connections to the transistor from other functional elements of a circuit. BEOL generally includes fabrication processes following the formation of the first metal level, including the formation of all subsequent metal levels. Each metal level can include metal wires therein, which can be connected to other metal levels through vertically-oriented conducting wires known as vias.

Pitch is a quantity which measures the periodic distance of two features. A value of pitch specifies a sum of the width of a feature (e.g., a transistor gate) and the space on one side of the feature separating that feature from a neighboring feature. Depending on the photolithographic process being used, factors such as optics and wavelengths of light or radiation restrict how small the pitch can be before features can no longer be reliably printed to a wafer or mask. As such, the pitch limits the smallest size of any features that can be created on a wafer. Various changes and improvements to IC fabrication, over time, have accommodated progressive reductions in pitch to provide greater component densities and greater operational sophistication in an IC product.

In some cases, continued reduction in pitch may increase the complexity of forming various elements of an IC structure. Transistors formed from semiconductor fins, conventionally known as "finFETs," may be processed to form source/drain and gate regions by masking a gate region of the fin and forming sidewall spacers to electrically passivate the sidewalls of the gate region. Forming masks with greater thickness over the semiconductor fin may help to define features at reduced amounts of pitch, but may increase the risk of material deformation or erosion in subsequent processing of the structure.

SUMMARY

A first aspect of the disclosure provides a method of forming an etch-resistant spacer, the method including: forming a mask on an upper surface of a gate structure positioned over a substrate; forming a spacer material on the substrate, the mask, and exposed sidewalls of the gate structure; forming a separation layer over the substrate and laterally abutting the spacer material to a predetermined height, such that an exposed portion of the spacer material is positioned above an upper surface of the separation layer and at least partially in contact with the mask; and implanting a dopant into the exposed portion of the spacer material to yield a dopant-implanted region within the spacer material, wherein the dopant-implanted region of the spacer material has a greater etch resistivity than a remainder of the spacer material.

A second aspect of the disclosure provides a method of forming an etch-resistant spacer, the method including: forming a mask on an upper surface of a gate structure positioned over a substrate; forming a spacer material on the substrate, the mask, and exposed sidewalls of the gate structure; forming a separation layer over the substrate and laterally adjacent to the spacer material to a predetermined height, such that an exposed portion of the spacer material is positioned above an upper surface of the separation layer and at least partially in contact with the mask; implanting oxygen into the exposed portion of the spacer material to yield an oxygen-implanted region within the spacer material, wherein the oxygen-implanted region of the spacer material has a greater etch resistivity than a remainder of the spacer material; and removing the separation layer and an underlying portion of the spacer material to expose the substrate, wherein the spacer material remains intact on at least the sidewalls of the gate structure.

A third aspect of the disclosure provides a method of forming an etch-resistant spacer, the method including: forming a mask on an upper surface of a gate structure positioned over a substrate; forming a spacer material on the substrate, the mask, and exposed sidewalls of the gate structure; forming a separation layer over the substrate and laterally proximal to the spacer material to a predetermined height, such that an exposed portion of the spacer material is positioned above an upper surface of the separation layer and proximal to the mask; implanting nitrogen into the exposed portion of the spacer material to yield a nitrogen-implanted region within the spacer material, wherein the nitrogen-implanted region of the spacer material has a greater etch resistivity than a remainder of the spacer material; and forming a high density plasma (HDP) deposited layer over the separation layer and laterally adjacent to the nitrogen-implanted region of the spacer material.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

Figure 1:
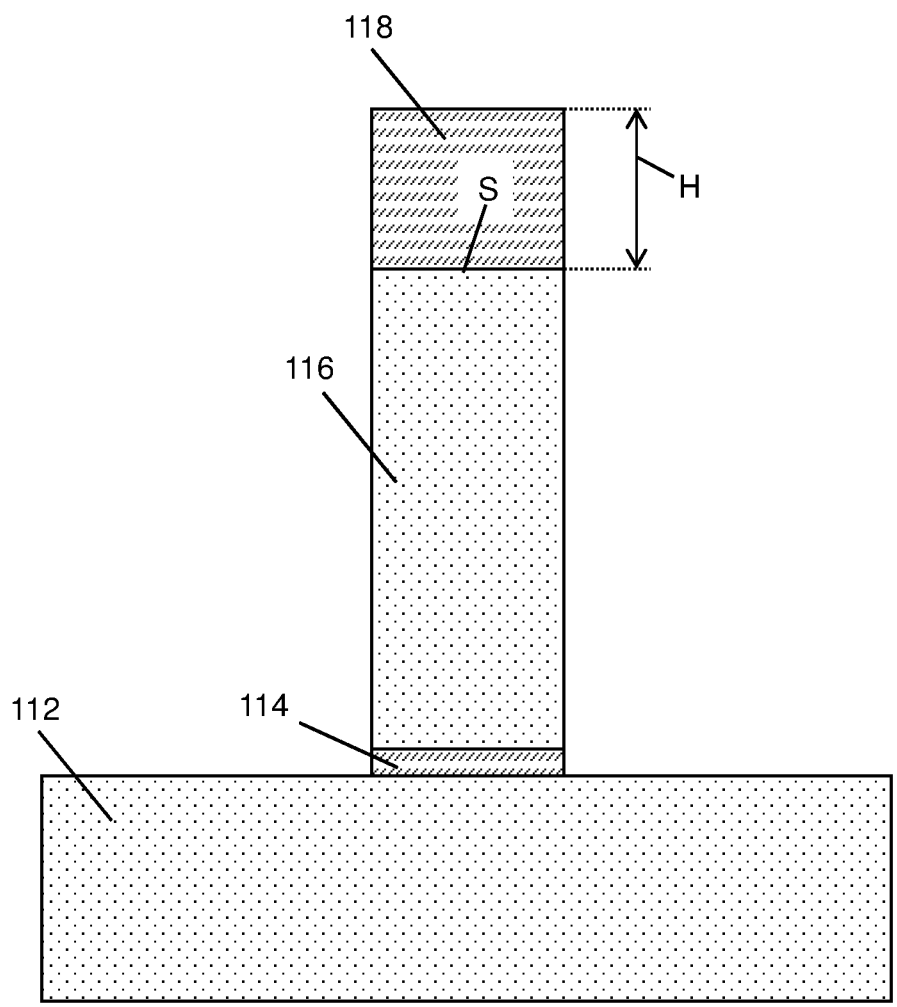
FIG. 1 shows a cross-sectional view of a gate structure and mask according to embodiments of the disclosure.

The disclosure relates to integrated circuit (IC) fabrication method of forming an etch-resistant spacer, i.e., a spacer resistant to deformation or degradation when exposed to etching in subsequent fabrication processes. Referring to FIG. 1, a substrate 112 composed of one or more semiconductor materials can be formed and/or otherwise provided as a precursor material for one or more transistor structures. Substrate 112 can include silicon, germanium, silicon germanium, silicon carbide, and other materials consisting essentially of, e.g., one or more III-V compound semiconductors having a composition defined by the formula $AlX1GaX2InX3AsY1PY2NY3SbY4$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other materials suitable for the composition of substrate 112 can include II-VI compound semiconductors having a composition $ZnA1CdA2SeB1TeB2$, where A1, A2, B1, and B2 are relative proportions each greater than or equal to zero and $A1+A2+B1+B2=1$ (1 being a total mole quantity). Furthermore, a portion or entirety of substrate 112 may be strained. Substrate 112 can take a variety of structural forms, e.g., a planar layer of bulk substrate material, a semiconductor-on-insulator (SOI) layer with one or more dielectric materials (not shown) positioned thereunder, one or more semiconductor fins positioned on an underlying semiconductor and/or insulator layer, etc. Where substrate 112 includes a fin-shaped semiconductor region, multiple substrates 112 may each be positioned on an underlying layer and oriented in parallel relative to one another. For the purposes of example and simplicity, other materials and/or layers positioned beneath substrate 112 have been omitted from the accompanying figures.

A gate dielectric 114, e.g., one or more dielectric materials adapted for use with a gate structure, e.g., a dummy gate, replacement metal gate, and/or other gate element for one or more transistor structures, can be positioned on a portion of substrate 112. A gate structure 116, e.g., one or more semiconductor layers such as a dummy gate material designed for removal and replacement with a metal gate in a subsequent process. It is understood that gate structure 116 may alternatively include, e.g., one or more other components structured to serve as a preliminary or operational structure of a gate in a transistor. However embodied, gate structure 116 can be positioned over substrate 112 and gate dielectric 114. Gate dielectric 114 can include, e.g., silicon dioxide ($SiO_2$), hafnium silicate (HfSiO), hafnium oxide ($HfO_2$), zirconium silicate ($ZrSiO_x$), zirconium oxide ($ZrO_2$), silicon nitride ($Si_3N_4$), silicon oxynitride (SiON), high-k material or any combination of these materials. Gate structure 116 may be formed from one or more materials included in substrate 112 and/or may include a different semiconductor material. As examples, gate structure 116 can include amorphous silicon and/or polycrystalline silicon formed on and in contact with gate dielectric 114, such that gate dielectric 114 separates gate structure 116 from substrate 112.

Gate structure 116 can include a mask positioned on an upper surface thereof, e.g., as a result of forming gate structure 116 from a larger layer or region of semiconductive material over substrate 112. Removing portions of semiconductor material to form gate structure 116 can cause mask 118 to remain intact on upper surface S of gate structure 116. In addition, forming gate structure 116 through the use of mask 118 can cause sidewalls of the resulting gate structure 116 to be exposed. The term "mask" generally refers to a layer of etch-resistant material which is applied over an underlying layer of material, and patterned to have openings, so that the underlying layer can be processed where there are openings. Mask 118 may be removed from gate structure 116 in subsequent processing or modification of the resulting IC structure, yet may remain in place over gate structure 116, e.g., to aid in forming and removing adjacent structures as discussed herein. Common masking materials are photoresist (resist) and nitride. Compounds formed to include nitride are generally considered to be a "hard mask" or "hard masking" material. In the case of a FinFET transistor structure, mask 118 can include, e.g., silicon nitride (SiN) and/or a combination of SiN and silicon dioxide ($SiO_2$). To accommodate the reduced lateral proximity between gate structure 116 and other structural elements, mask 118 may have a greater height above gate structure 116 relative to conventional masks positioned on gate structures 116. According to the disclosure, the height of mask 118 above upper surface S of gate structure 116 can be greater than a height of gate structure 116 above substrate 112. Mask 118 may have a height H above, e.g., gate structure 116 of between approximately fifteen nanometers (nm) and approximately forty nm in an example implementation. During fabrication, gate dielectric 114, gate structure 116, and mask 118 may be formed uniformly across a wafer structure and/or substrate 112, e.g., by deposition. Thereafter a patterning process (e.g., a single optical lithographic exposure followed by plasma dry etch, and/or other processing techniques) can yield gate dielectric 114, gate structure 116, and mask 118 only on targeted portions of substrate 112, e.g., the desired location(s) of transistor gates. Although gate dielectric 114, gate structure 116, and mask 118 are described by example herein as being distinct structural elements, it is understood that gate dielectric 114, gate structure 116, and mask 118 may alternatively be considered to form parts of a single "gate structure," "dummy gate," "replacement gate," etc., in various embodiments.

Figure 2:
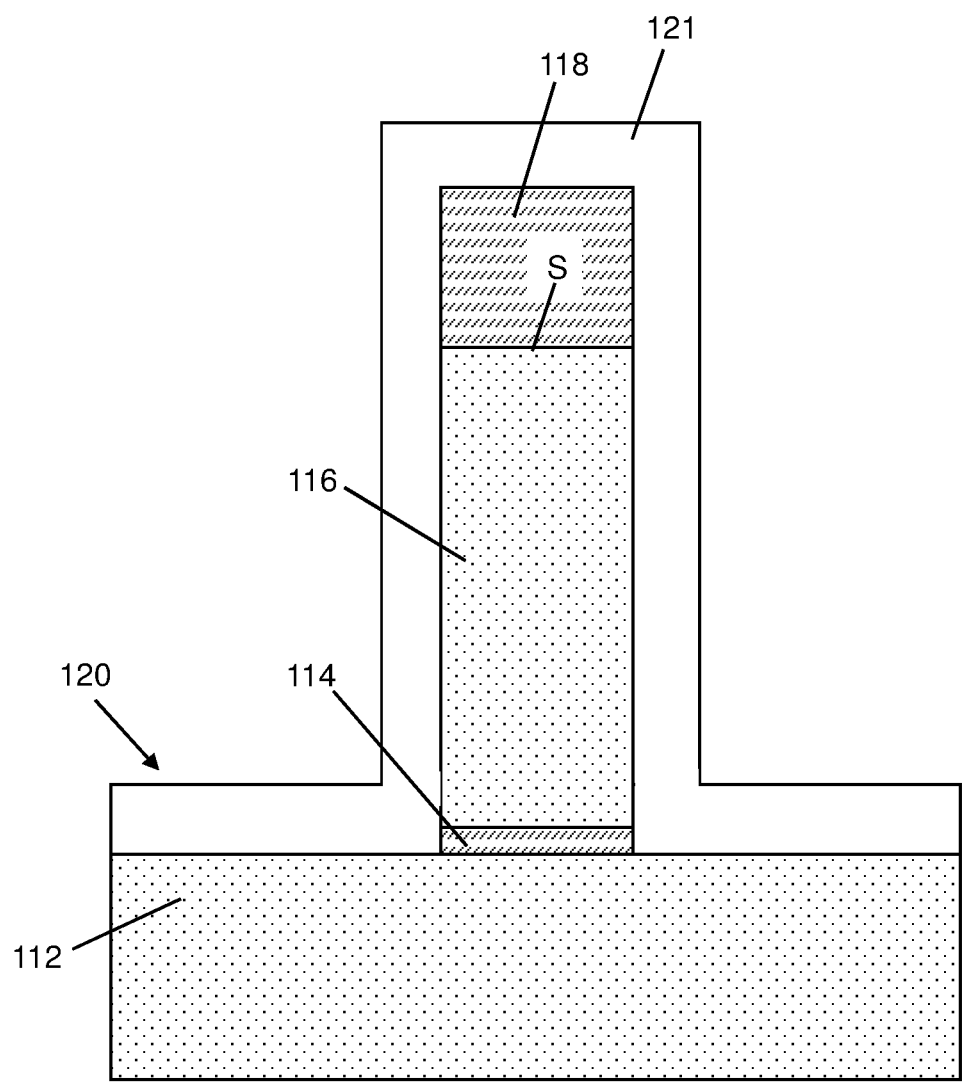
FIG. 2 shows a cross-sectional view of a spacer material being formed on the gate structure and mask according to embodiments of the disclosure.

Turning to FIG. 2, the disclosure includes forming a spacer material 120 on the various structures described herein. In particular, spacer material 120 can cover portions of gate structure 116 targeted to form a gate of a resulting finFET transistor structure. As shown, spacer material 120 can include an insulator layer 121 formed on substrate 112, exposed sidewalls of gate dielectric 114 and gate structure 116, and exposed surfaces of mask 118. Insulator layer 121 of spacer material 120 can include a dielectric material and/or any other electrically non-conducting material or substance. Example materials operable to serve as insulator layer 121 of spacer material 120 can include one or more oxide compounds including, e.g., silicon nitride (SiN), silicoboron carbonitiride (SiBCN), silicon oxycarbonitride (SiOCN), silicon oxycarbide (SiOC), etc. The insulating quality of an electrically insulating material may be characterized by "k," the dielectric constant. Generally, the higher the "k," the better the insulating quality of the dielectric. Oxide, for example, has a k of approximately 3.9. A class of materials, referred to as "high-k" (or "high-K") dielectrics, have a dielectric constant higher than that of oxide (k>3.9). Insulator layer 121 of spacer material 120 may thus include, e.g., one or more materials having a dielectric constant between approximately 4.0 and approximately 7.0 However embodied, insulator layer 121 of spacer material 120 can initially be formed as a coating upon exposed surfaces of substrate 112, gate dielectric 114, gate structure 116, mask 118, etc., as shown.

Figure 3:
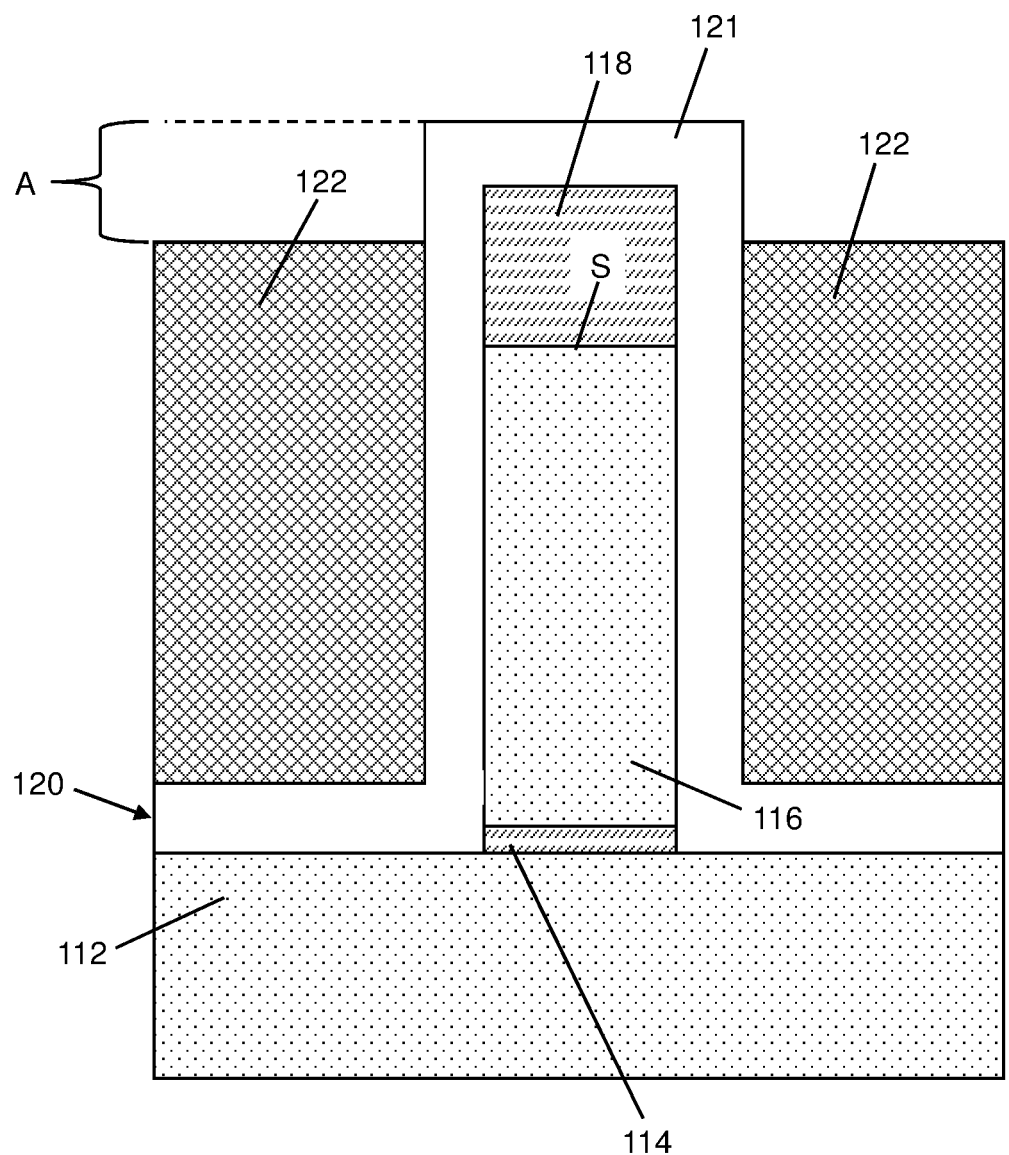
FIG. 3 shows a cross-sectional view of a separation layer being formed on the spacer material and over a substrate according to embodiments of the disclosure.

Referring to FIG. 3, the disclosure can include forming a separation layer 122 above substrate 112 to cover portions of spacer material 120. Separation layer 122 can generally include one or more substances which remain inert when subjected to an annealing process, e.g., one or more oxides, and/or one or more planarization layers such as an organic planarization layer (OPL). A "planarizing layer" generally refers to any material formed on a surface to produce a planar surface, and can be formed by, e.g., the deposition of material followed by polishing, deposition followed by the forming of a flowable oxide material thereon, deposition alone, and/or any other currently known or later developed process or combination of processes. Separation layer 122, when in the form of an organic planarizing layer (OPL), can include one or more carbon films removable by wet and/or dry etching processes. As shown, a separation layer 122 can be formed by blanket depositing separation layer 122 over each exposed structural element, and then etching separation layer back 122 to expose at least a portion A of spacer material 120. In alternative embodiments, separation layer 122 can be formed from a predetermined amount of deposited material and/or by depositing separation layer 122 on insulator layer 121 of spacer material 120 over a predetermined time, such that at least portion A of spacer material 120 remains exposed. Separation layer 122 can laterally abut sidewalls of spacer material 120 formed on gate structure 116 after being formed. Exposed portion A of spacer material 120 can have a predetermined height, e.g., between approximately ten nm and approximately fifteen nm. Exposed portion A of spacer material 120 can be positioned directly on and/or in contact with mask 118.

Figure 4:
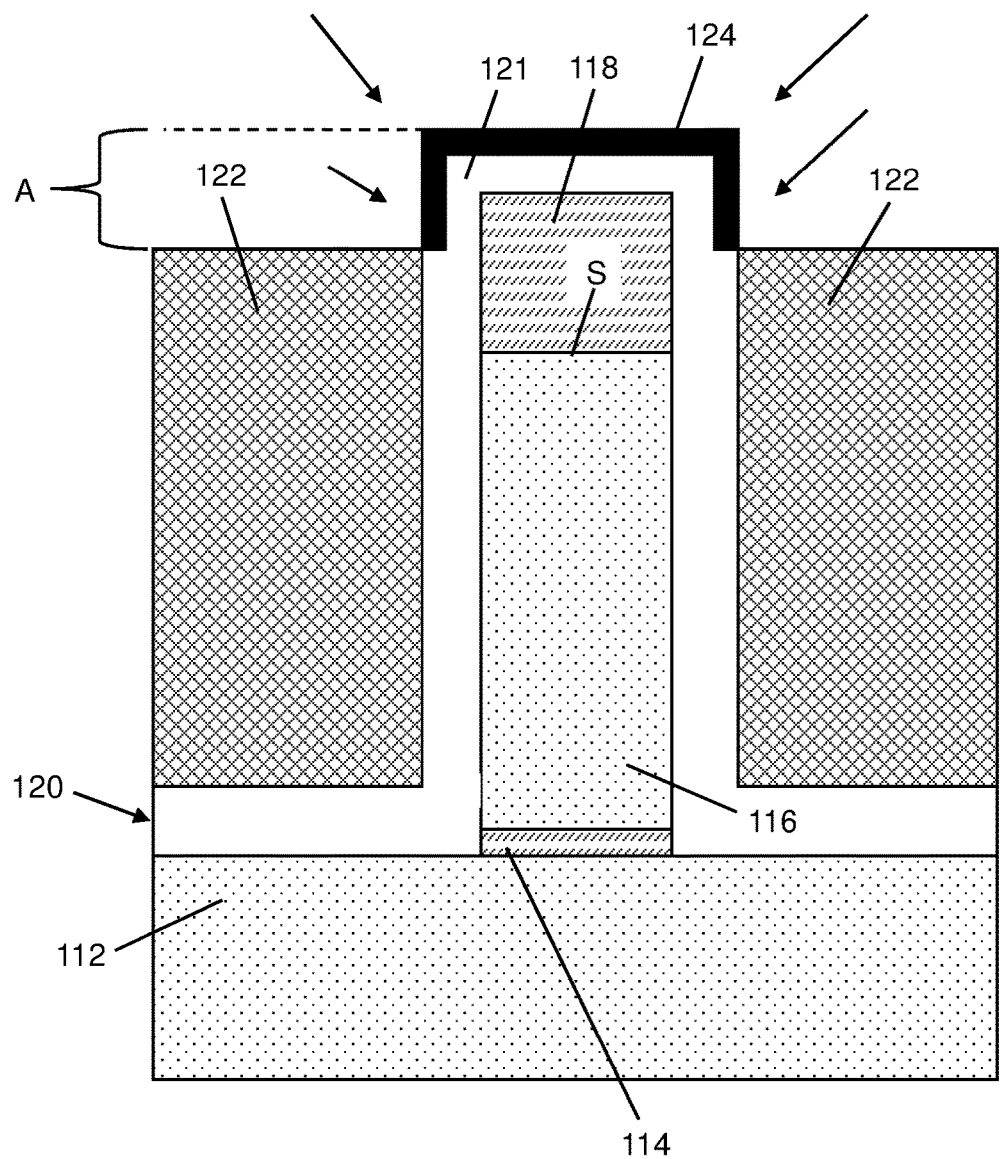
FIG. 4 shows a cross-sectional view of a dopant being implanted into the spacer material according to embodiments of the disclosure.

As illustrated in FIG. 4, the present disclosure can include implanting (illustrated, e.g., with arrows in FIG. 4) one or more dopants into exposed portion A of spacer material 120, thereby yielding a dopant-implanted region 124. Dopant-implanted region 124 can extend into the composition of insulator layer 121 to a predetermined thickness, e.g., based on the manner in which a user implants dopants into spacer material 120. Doping generally refers to the process of introducing impurities, typically known as dopants, into a substrate or elements formed thereon. Doping is often performed with previously-formed elements in place, e.g., separation layer 122, so that only certain areas of material, e.g., exposed portion A of insulator layer 121 of spacer material 120, will be doped. An ion implanter is typically employed for the actual implantation. An inert carrier gas such as nitrogen is usually used to bring in the dopant or other implanted impurity. Embodiments of the present disclosure generally include implanting one or more etch-resistant ions into exposed portion A of spacer material to yield an etch-resistant spacer. More specifically, dopant-implanted region 124 can have a greater etch resistivity than the remainder of insulator layer 121 in spacer material 120. In an example, dopant-implanted region 124 can be doped to include one or more materials resistant to selective etching, e.g., oxygen ions and/or nitride ions, depending on the composition of insulator layer 121 of spacer material 120. For example, insulator layer 121 may be a nitride based spacer, such as SiN, SiBCN, and dopant-implanted region 124 can be formed by implanting oxygen ions into insulator layer 121 of the spacer material 120 such that surface of that implanted region 124 at least partially include one or more oxide compounds, e.g., $SiO_2$ or SiON, which resist the selective etching of nitride. During a subsequent etch of the structure, dopant-implanted region 124 can protect underlying portions of spacer material 120 and/or other structures from being etched.

Figure 5:
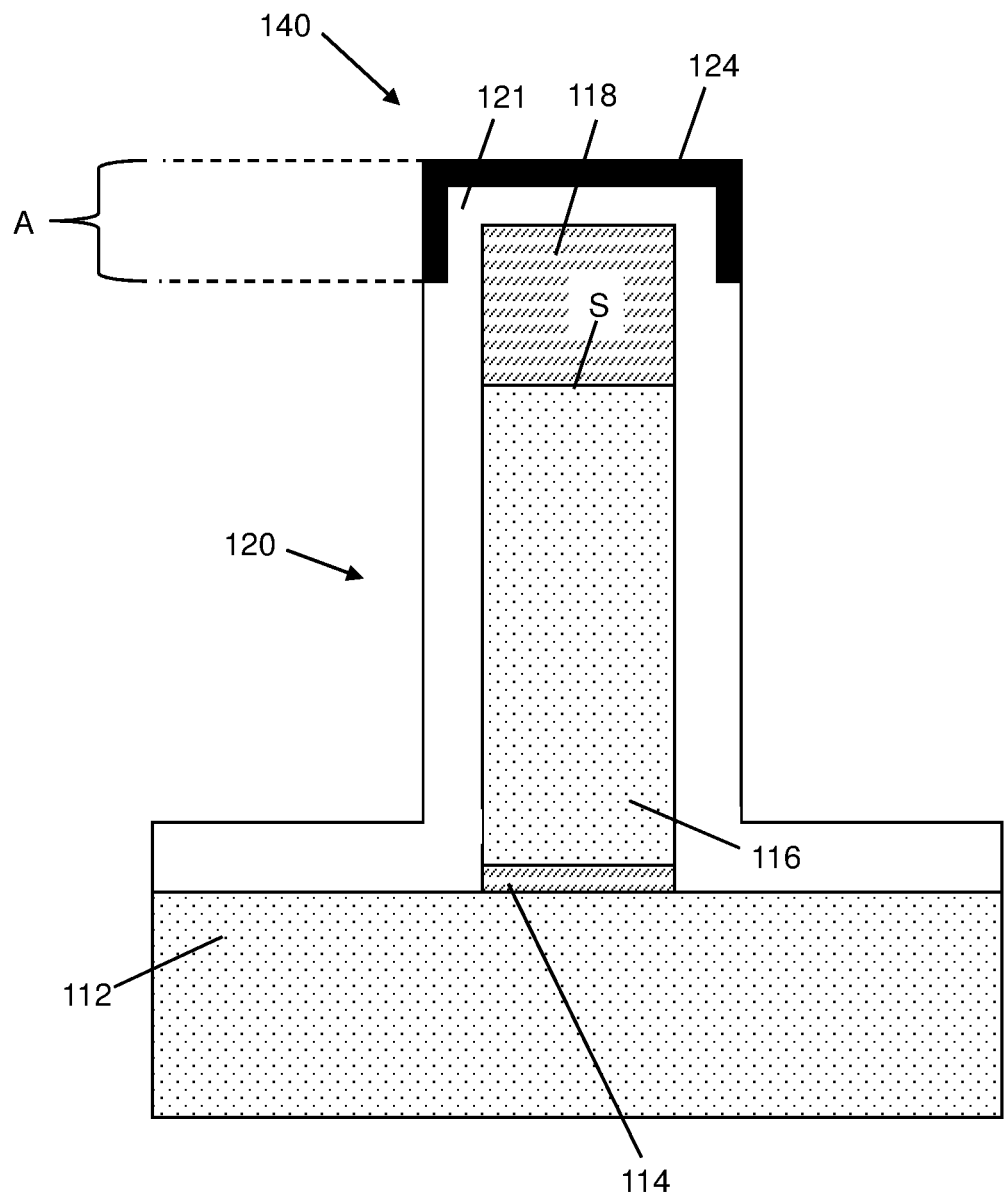
FIG. 5 shows a cross-sectional view of an etch-resistant spacer on a gate structure according to embodiments of the disclosure.

Turning to FIG. 5, the present disclosure can include removing separation layer 122 (FIGS. 3-4) after forming dopant-implanted region 124. Separation layer 122 can be removed to expose buried portions of spacer material 120 thereunder, e.g., by any currently known or later-developed technique for removing a targeted material while leaving other materials intact. Where separation layer 122 includes an oxide, OPL, or similar material, separation layer 122 can be removed by way of ashing and/or similar techniques. Ashing generally refers to the selective removal of organic elements by volatilization, e.g., by using one or more strongly oxidizing ambient materials or techniques (e.g., oxygen plasma ashing). It is understood that separation layer 122 can be removed by alternative techniques in further embodiments. Spacer material 120, including insulator layer 121 and/or dopant-implanted region 124 thereof, can remain intact after separation layer 122 is removed. Structural effects of forming separation layer 122 before forming nitride-implanted region 124 can include, e.g., dopant-implanted region 124 being substantially vertically coplanar with underlying sidewalls of spacer material 120. Thus, some portions of spacer material 120 coating sidewalls of gate structure 116 may remain intact without having dopant-implanted regions 124 therein.

In addition to ashing and/or other techniques for removing material, it is understood that "removing" as discussed herein may refer to other techniques. For example, removal by stripping generally refers to a process of material removal from an exposed structure or surface, and typically implies that removal is not carried out to pattern the structure. Some materials can also be removed, e.g., by etching. Etching generally refers to the removal of material from a substrate (or structures formed on the substrate), and is often performed with a mask in place so that material may selectively be removed from certain areas of the substrate, while leaving the material unaffected in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotopically, but a wet etch may also etch single-crystal materials (e.g. silicon wafers) anisotopically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases which approach the wafer approximately from one direction, and therefore this process is highly anisotopic. Reactive-ion etching (RIE) operates under conditions intermediate between sputter and plasma etching and may be used to produce deep, narrow features, such as STI trenches.

Figure 6:
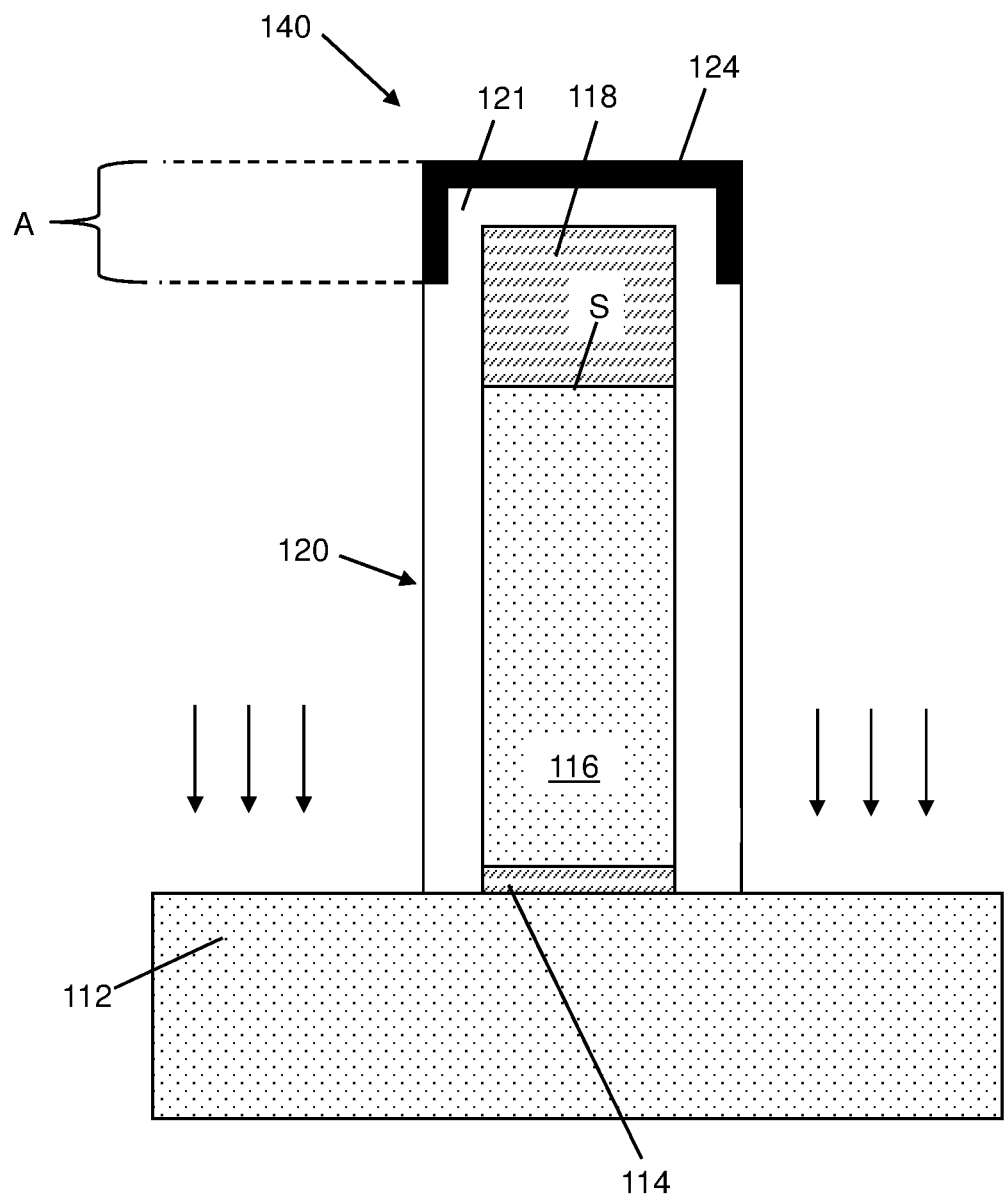
FIG. 6 shows a cross-sectional view of a spacer material being removed from a substrate according to embodiments of the disclosure.

Referring to FIG. 6, embodiments of the disclosure can include removing portions of spacer material 120 after forming dopant-implanted region(s) 124. As discussed herein, dopant-implanted region(s) 124 may include oxide compounds therein and/or other materials resistant to etchants which selectively target nitride material (e.g., by a directional plasma etch). As shown by arrows in FIG. 6, spacer material 120 can be contacted with one or more etchants for selectively etching nitride materials, thereby exposing underlying portions of substrate 112. As shown, the presence of dopant-implanted region(s) 124 may cause portions of spacer material 120 on gate structure 116 and mask 118 to remain substantially intact as other portions of spacer material 120 are removed. The etch selectivity of dopant-implanted region(s) 124 relative to spacer material 120 can thus reduce the thickness of mask 118 relative to other processing structures.

Figure 7:
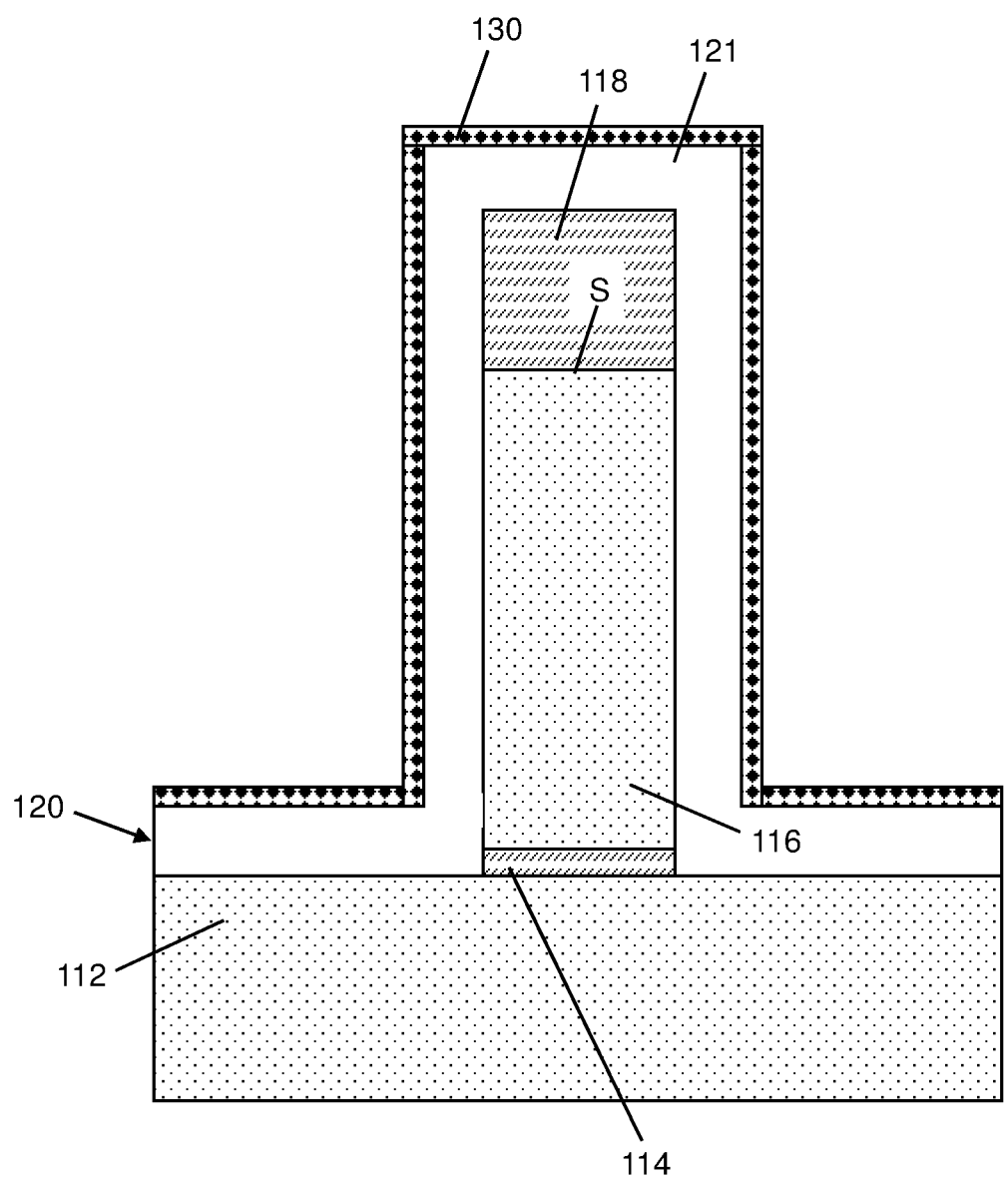
FIG. 7 shows a cross-sectional view of depositing a liner film on an insulator layer to form the spacer material according to embodiments of the disclosure.

Turning to FIGS. 2 and 7 together, the present disclosure can include modified techniques of forming one or more etch-resistant spacers. It is thus understood that the various processes described herein relative to FIGS. 1-6 can be implemented in addition to or as an alternative to various other processes discussed by example. It is therefore understood that the various techniques to form etch-resistant spacers need not be mutually exclusive from one another. In an embodiment, forming spacer material 120 can include forming one or more liner films 130 (FIG. 7 only) on exposed surfaces of insulator layer 121. Spacer material 120 can thus include two layers of material: insulator layer 121 and liner film 130 thereon. FIG. 2 depicts insulator layer 121 being exposed, and FIG. 7 depicts spacer material 120 after liner film 130 is formed on insulator layer 121.

Liner film 130 may be formed on insulator layer 121, e.g., by deposition and/or any other currently-known or later developed process of forming a material on exposed surfaces of a structure. As used herein, the term "deposition" generally refers to any currently known or later developed technique appropriate for liner film 130 or other materials to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and/or evaporation. Liner film 130 can be formed from one or more conductive and/or semiconductor materials including without limitation: silicon (Si), germanium (Ge), aluminum (Al), etc. Liner film 130 can conformally coat exposed surfaces of insulator layer 121 of spacer material 120 after being formed.

Figure 8:
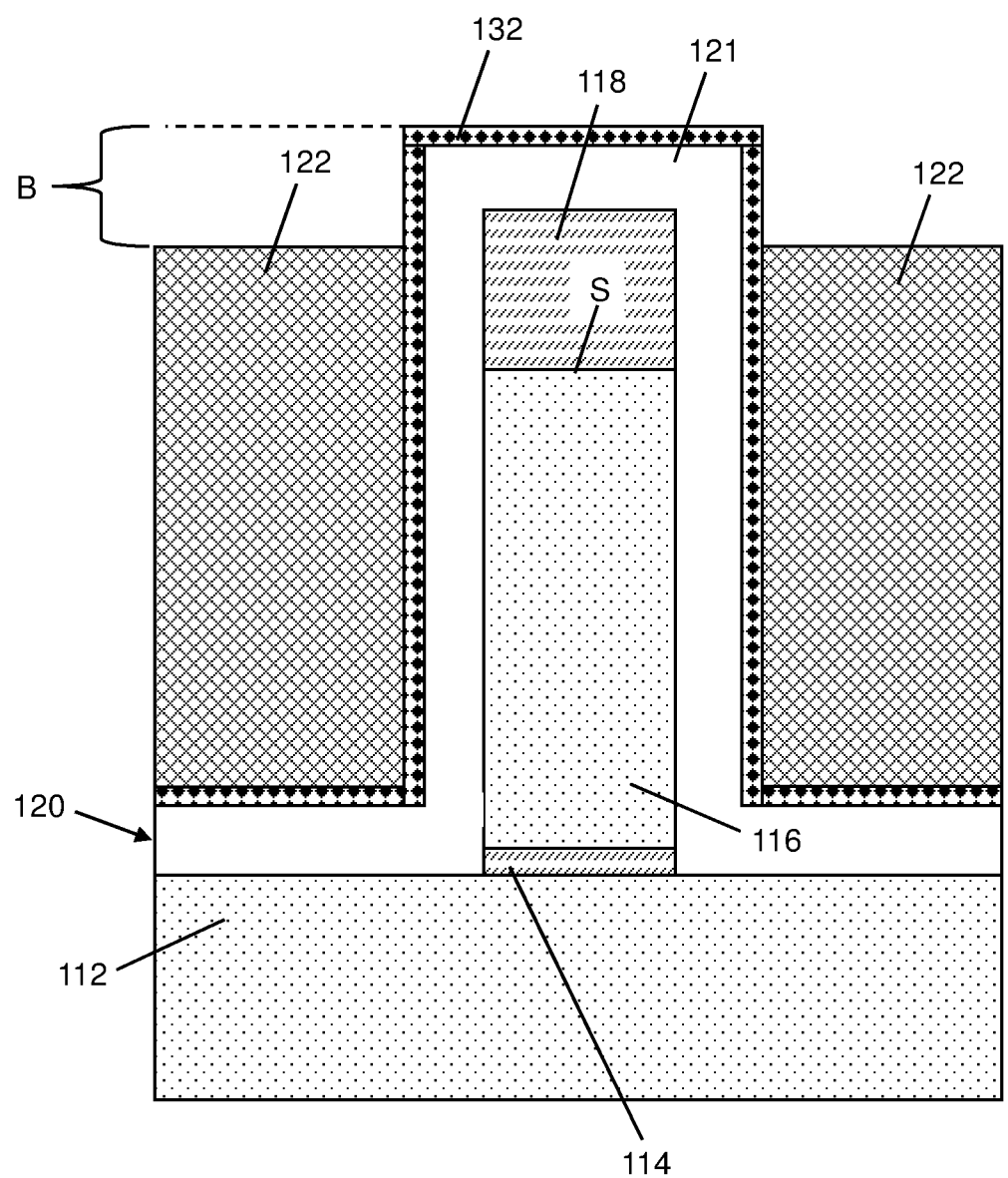
FIG. 8 shows a cross-sectional view of a separation layer being formed on the liner film according to embodiments of the disclosure.
Figure 9:
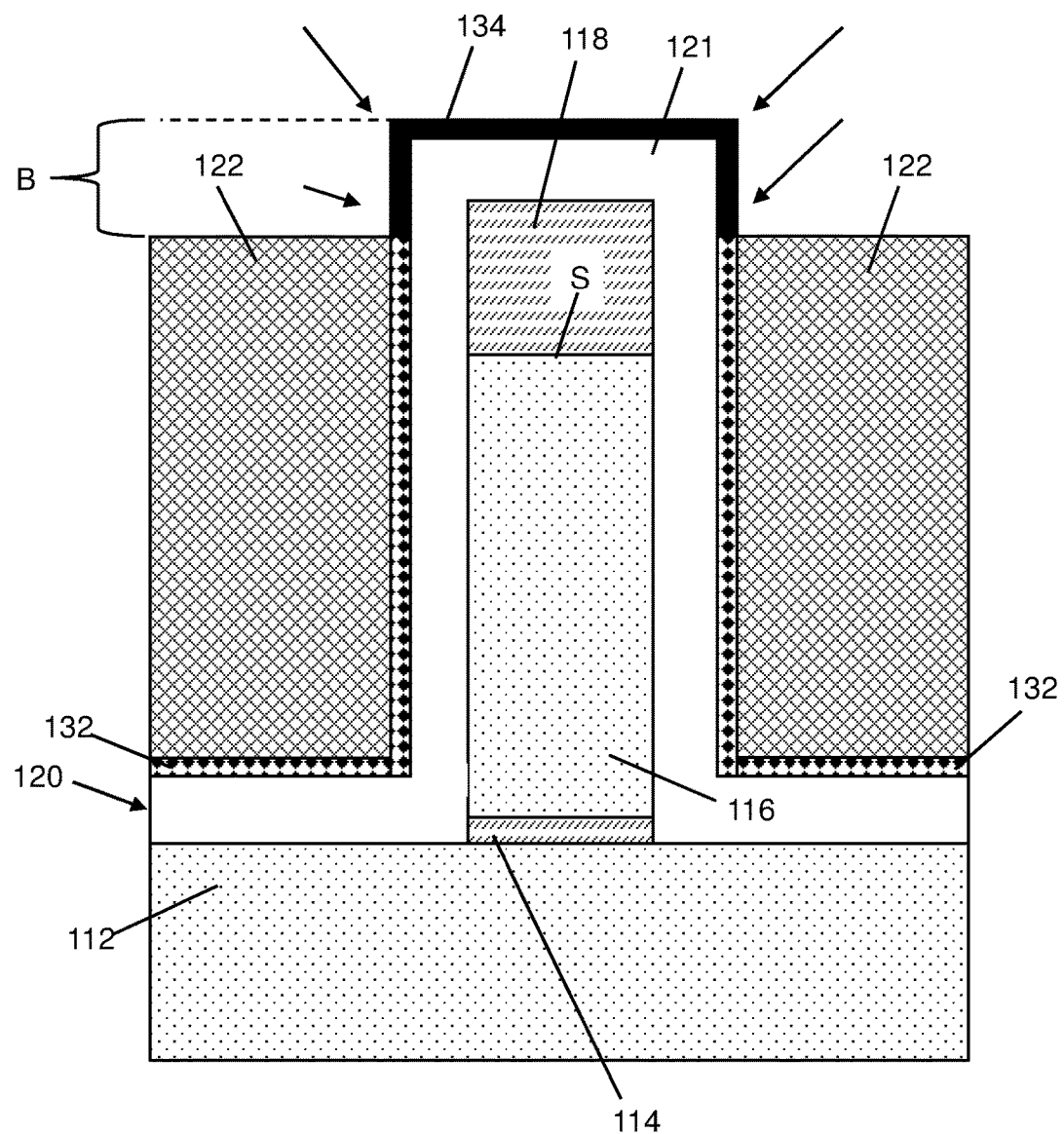
FIG. 9 shows a cross-sectional view of a dopant being implanted into the liner film of the spacer material according to embodiments of the disclosure.

Turning to FIG. 8, the disclosure can include forming separation layer 122 on liner film 130 of spacer material 120 to a predetermined height relative to liner film 130. Separation layer 122 can be formed on exposed portions of liner film 130 without fully covering liner film 130 by one or more of the example processes of forming separation layer 122 described elsewhere herein. As shown, a portion B of liner film 130 coating spacer material 120 in contact with mask 118 may be positioned above separation layer 122. Referring now to FIG. 9, exposed portion B of liner film 130 can be converted to a dopant-implanted region 134 over spacer material 120 (illustrated, e.g., with arrows in FIG. 9). Converting liner film 130 to dopant-implanted region 134 can include, e.g., one or more of the example processes described herein for implanting etch-resistant ions into liner film 130. In a further example, forming dopant-implanted region 134 can include implanting oxygen ions into exposed portion B of liner film 130 to yield, e.g., silicon oxide ($SiO_2$), aluminum oxide ($AlO_3$) and/or similar etch-resistant compounds based on the composition of liner film 130. Despite the conversion of exposed portion B of liner film 130 to dopant-implanted region 134, underlying portions of insulator layer 121 can remain intact on gate structure 116 and/or mask 118. Furthermore, portions of liner film 130 buried by separation layer 122 may remain free of dopants.

Figure 10:
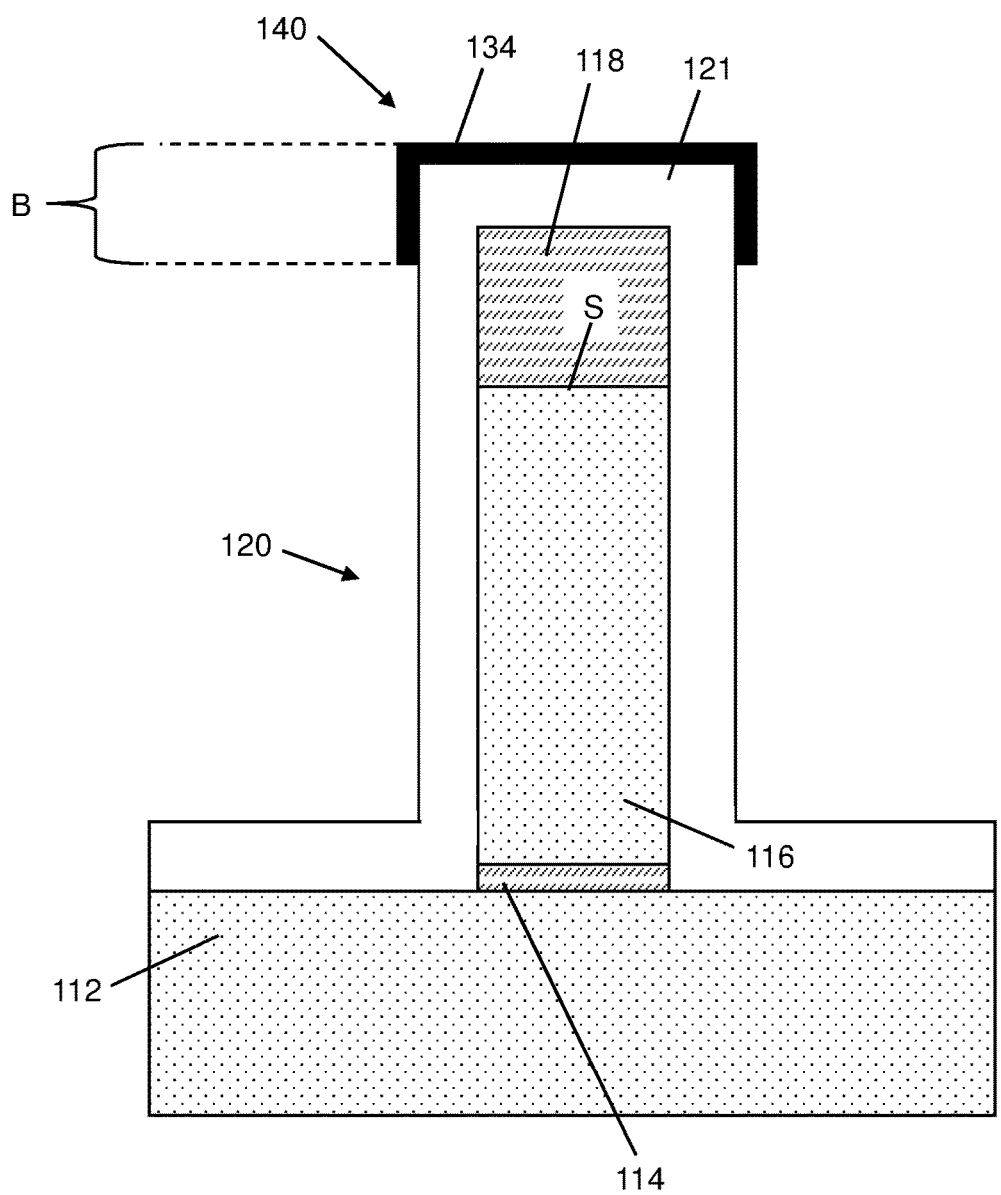
FIG. 10 shows a cross-sectional view of another etch-resistant spacer on a gate structure according to embodiments of the disclosure.

Turning to FIG. 10, embodiments of the present disclosure can include removing separation layer 122 and portions of liner film 130 without dopants implanted therein. Separation layer 122 can be selectively removed while leaving other structures (e.g., spacer material 120, dopant-implanted region 134) intact by one or more currently known or later-developed techniques for selectively removing separation layer 122 discussed elsewhere herein. It is understood that remaining portions of liner film 130 can also be removed by one or more etchants operable for removing separation layer 122, or that liner film 130 can be selectively removed in a separate etching and/or removal procedure. After portions of liner film 130 not converted to dopant-implanted region(s) 134 have been removed, the method can then proceed to removing portions of spacer material 120 not covered by dopant-implanted region 134 to expose substrate 112 thereunder, e.g., as shown in FIG. 6. Regardless of processing distinctions between forming dopant-implanted regions 124, 134, embodiments of the disclosure can be operable to remove spacer material 120 positioned on substrate 112 while leaving spacer material 120 intact on gate structure 116 and mask 118.

Referring to FIGS. 5-6 and 10 together, the disclosure can yield an IC structure 150 in which spacer material 120 and dopant-implanted region(s) 124, 134 define an etch-resistant spacer 150 on gate structure 116 and mask 118. The various processes discussed herein relative to liner film 130 may differ from other processes in that at least a portion of dopant-implanted region 134 (FIG. 10 only) overhangs space from which liner film 130 (FIGS. 7-9) was removed. Regardless of whether dopant-implanted regions 124 (FIGS. 5-6), 134 (FIG. 10) include differences in material composition, etch-resistant spacers 150 can yield one or more technical advantages, e.g., by having increased resistance to etchant compounds relative to other portions of spacer material 120. As discussed elsewhere herein, dopant-implanted region(s) 124, 134 can protect underlying portions of spacer material 120 from being etched or otherwise removed in future etching and processing of IC structures which include etch resistant spacer(s) 150 therein.

Figure 11:
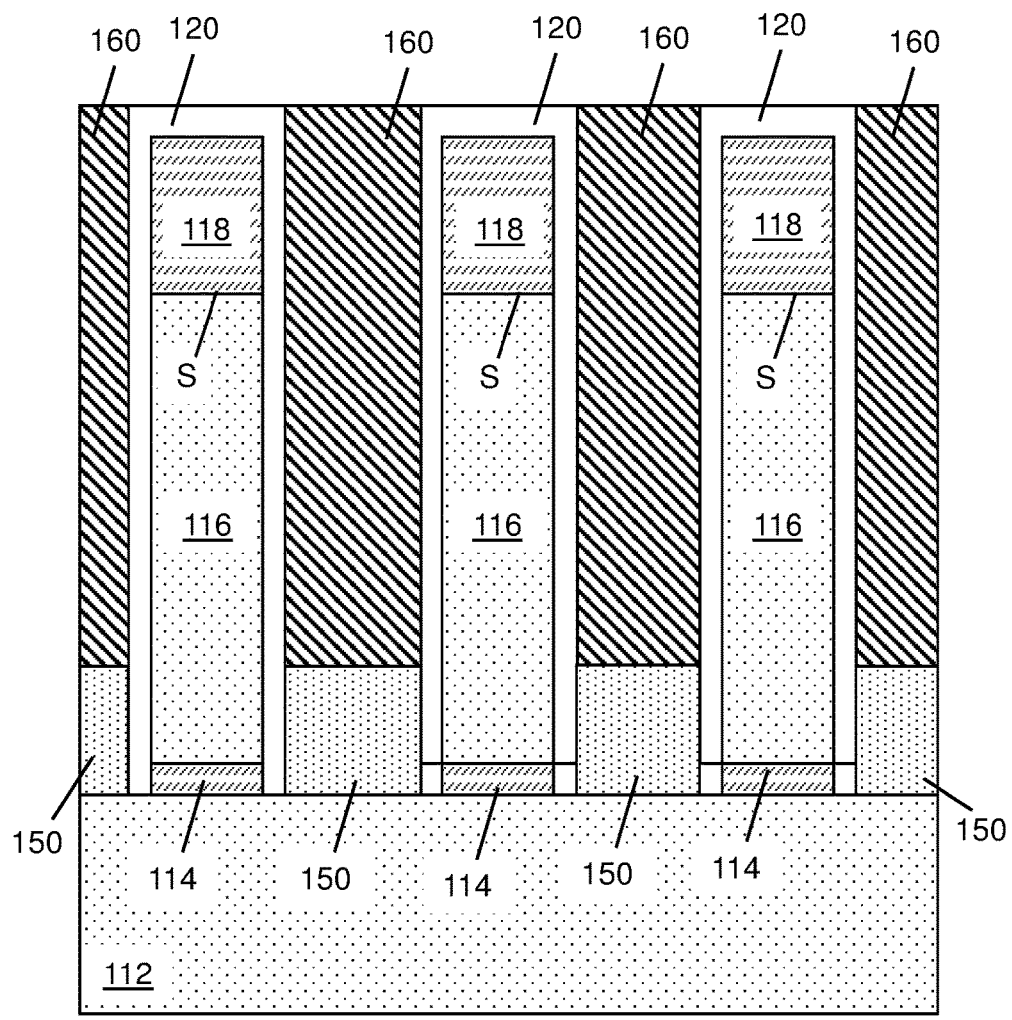
FIG. 11 shows a cross-sectional view of an oxide and gate structures with spacer material thereon according to embodiments of the disclosure.

Turning to FIG. 11, the present disclosure can include further processes of forming etch-resistant materials from or within spacer material 120. The various processes discussed herein can be implemented on multiple gate structures 116, e.g., to reduce or prevent structural degradation of gate structures 116 during subsequent deposition of insulator materials (e.g., one or more high density plasma (HDP) deposited layers) adjacent to gate structures 116 as discussed herein. Each gate structure 116 on substrate 112 can be coated with spacer material 120, e.g., as described elsewhere herein. Substrate 112 can optionally include a source/drain region 150 formed thereon. Source/drain region 150 can include one or more semiconductor materials included in the composition of substrate 112, and/or may include different semiconductor materials. However embodied, source/drain region 150 can be formed on exposed surfaces of substrate 112, e.g., by epitaxial growth. "Epitaxy" or "epitaxial growth" generally refers to a process by which a thin layer of crystalline material is deposited on an underlying layer of crystalline material (e.g., substrate 112) and then grown to an expanded thickness. Epitaxial growth occurs such that the crystallographic structure of the underlying material (e.g., substrate 112) is reproduced in the grown material (e.g., source/drain region 150). Thus, source/drain region 150 can be considered to form part of substrate 112. Source/drain regions 150 may also be omitted from other lateral-cross sections of a structure or in alternative embodiments.

Lateral spaces between each gate structure 116 can be filled with an insulator 160 composed of, e.g., one or more currently known or later-developed dielectric materials. Insulator 160 can include, e.g., one or more flowable oxide materials and/or other insulators capable of being formed between gate structures 116. Flowable oxide materials may be included in the composition of insulator 160, e.g., to at least partially fill the lateral space between gate structures 116 where the separation distance between each gate structure 116 is relatively small. According to an example, insulator 160 between spacers 120 of gate structures 116 can include a field oxide material, e.g., one or more oxide compounds selected to passivate and protect materials buried thereunder (e.g., substrate 112, gate structures 116, spacer material 120, source/drain regions 150, etc.) without otherwise affecting electrical operation of the structure. Although multiple gate dielectrics 114, gate structures 116, and masks 118 are shown in FIG. 11, their structural properties may be similar to or the same as those of gate dielectric 114, gate structure 116, and mask 118 depicted in FIGS. 1-10, and discussed elsewhere herein.

Figure 12:
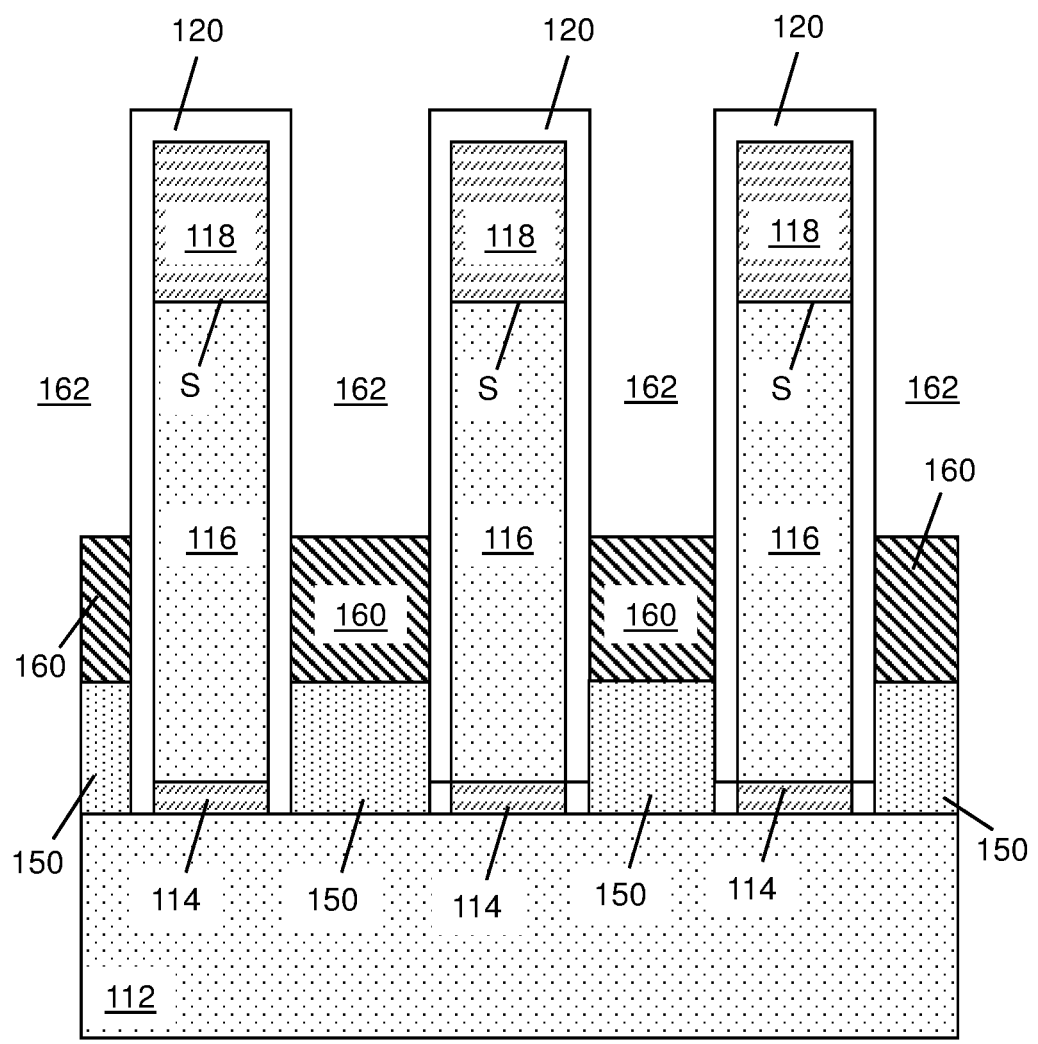
FIG. 12 shows a cross-sectional view of recessing an oxide to expose spacer material according to embodiments of the disclosure.

Turning to FIG. 12, embodiments of the disclosure can include removing at least a portion of insulator 160 to form openings 162 laterally between spacer material 120 of each gate structure 116. Portions of insulator 160 can be removed, e.g., through the use of one or more selective etchants which do not affect the composition of spacer material 120. In this case, the amount of etchant and/or the etching time may be selected such that at least a portion of insulator 160 remains intact over substrate 112, source/drain regions 150, and portions of spacer material 120 after the etching concludes. The depth of each opening 162 relative to the upper surface of spacer material 120, in addition, may be greater than a predetermined depth for creating etch-resistant regions within spacer material 120.

Figure 13:
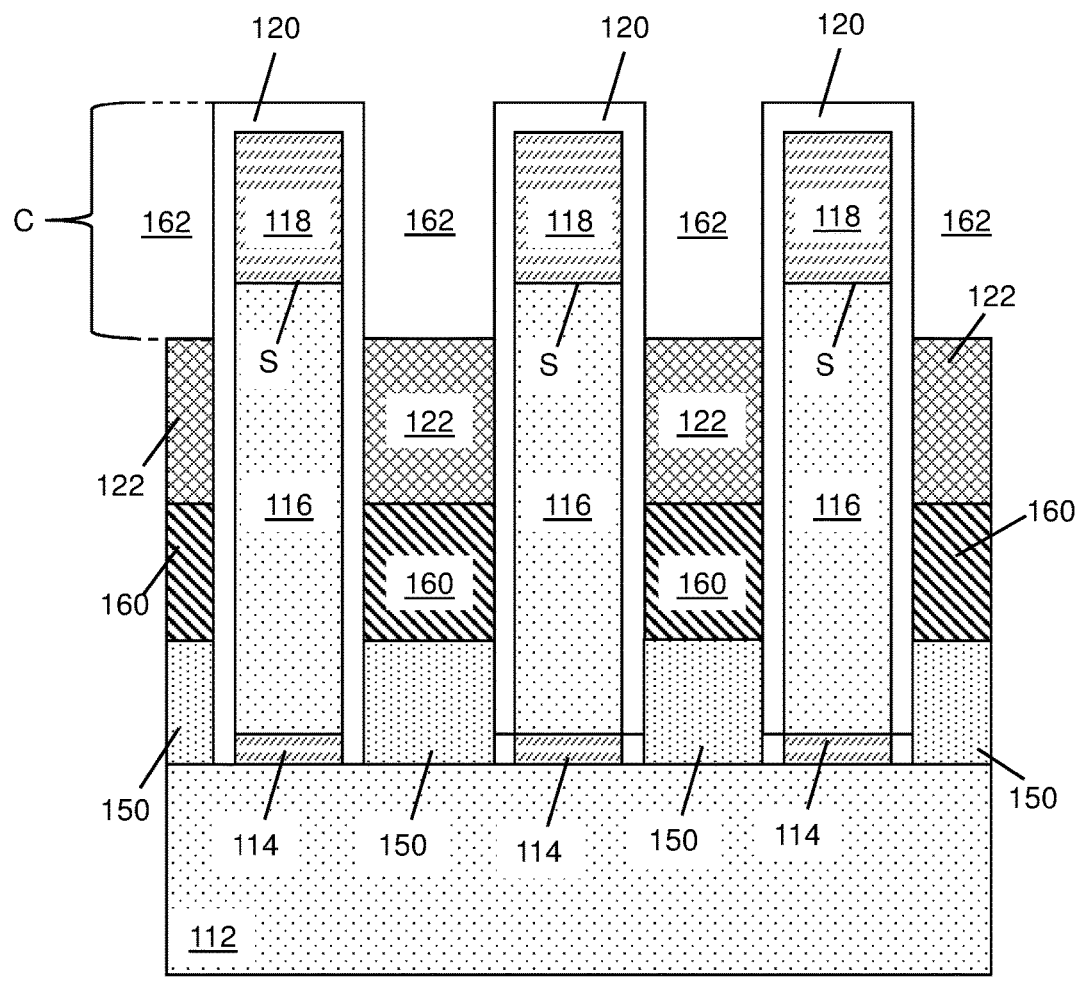
FIG. 13 shows a cross-sectional view of forming a separation layer on the insulator according to embodiments of the disclosure.

Turning to FIG. 13, the present disclosure can include forming a separation layer 122 on insulator 160, and between laterally adjacent gate structures 116, to at least partially fill openings 162. Separation layer 122 can include, e.g., OPL materials and/or other insulating substances, as described by example elsewhere herein. Separation layer 122 can be formed to completely cover spacer material 120 and gate structures 116 thereafter, before being etched back (e.g., with one or more selective etchants) to form openings 162 and expose a portion C of spacer material 120 positioned above separation layer 122. In alternative embodiments, the amount of material deposited to form separation layer 122 and/or the time elapsed during deposition can be controlled to form openings 162 and expose portion C of spacer material 120. In any case, portion C of spacer material 120 can laterally abut and contact at least mask 118 and/or portions of gate structure 116, similar to other techniques described herein. The combined height of insulator 160 and separation layer 122 can be approximately equal to a height to which a fabricator wishes to leave spacer material 120 intact on gate structure 116.

Figure 14:
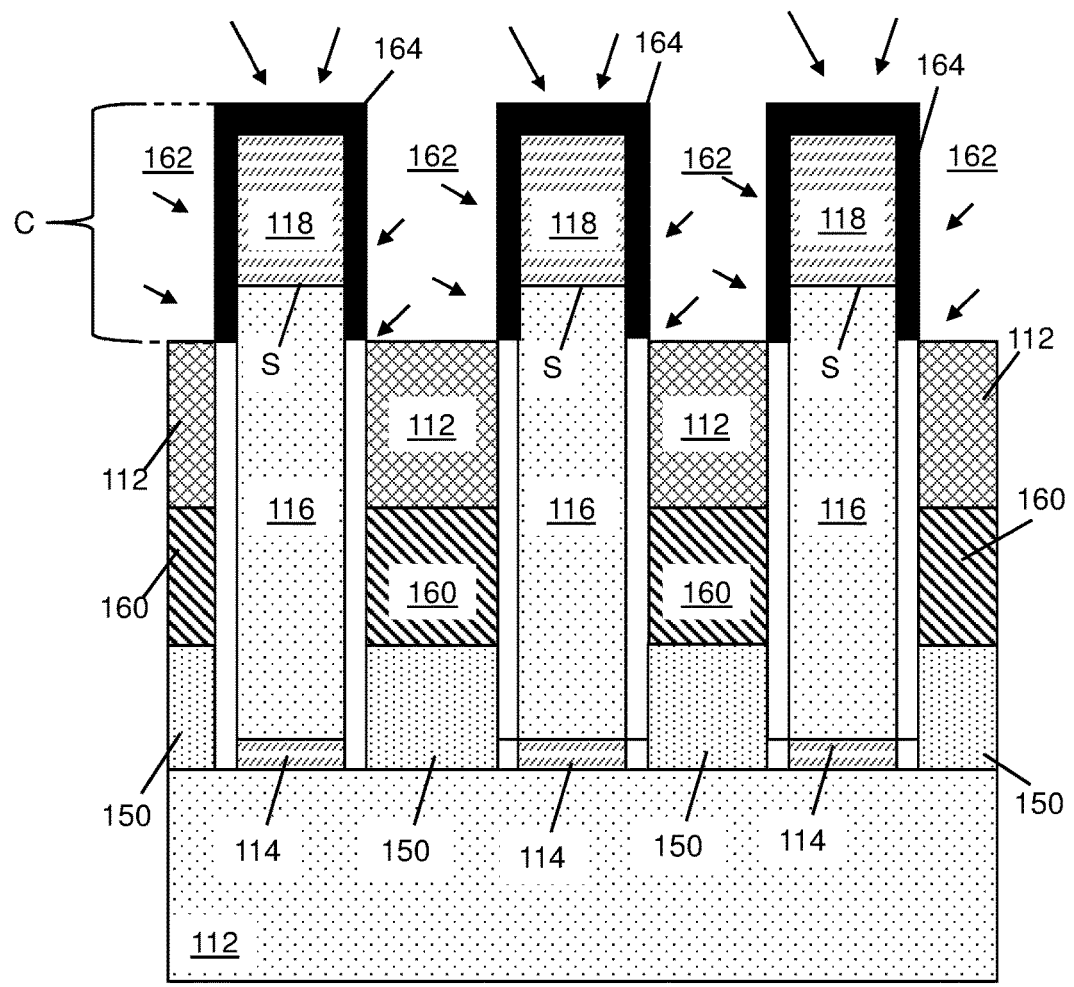
FIG. 14 shows a cross-sectional view of implanting nitrogen into exposed portions of the spacer material according to embodiments of the disclosure.

FIG. 14 depicts portion C of spacer material 120 being processed to yield an increased etch resistivity. As discussed elsewhere herein, spacer material 120 in portion C can be implanted with dopants (depicted by arrows in FIG. 14) to yield a dopant-implanted region 164. After being formed, dopant-implanted region 164 can laterally abut mask 116 along sidewalls and an upper surface thereof. Dopant-implanted region 164 can optionally be positioned in contact with portions of gate structure 116 under mask 118. In further embodiments and/or through alternative dopant implantation techniques, dopant-implanted region 164 may only coat sidewalls of mask 116 with an upper surface of spacer material 120 being partially left intact. Remaining portions of spacer material 120 buried under separation layer 122, insulator 160, etc., may remain intact and free of dopants therein. In an embodiment, forming dopant-implanted region 164 in spacer material 120 can include implanting spacer material 120 with nitrogen ions to form a nitride compound. Such nitride compounds of dopant-implanted region 164 can include, e.g., silicon nitride (SiN), aluminum nitride (AlN), etc., based on the material composition of spacer material 120, the manner in which nitride is implanted within spacer material 120, etc. In the case of nitride implantation, the disclosure can also include annealing dopant-implanted region 164 after nitride ions are implanted therein, e.g., to improve the etch resistance of dopant-implanted region 164.

Figure 15:
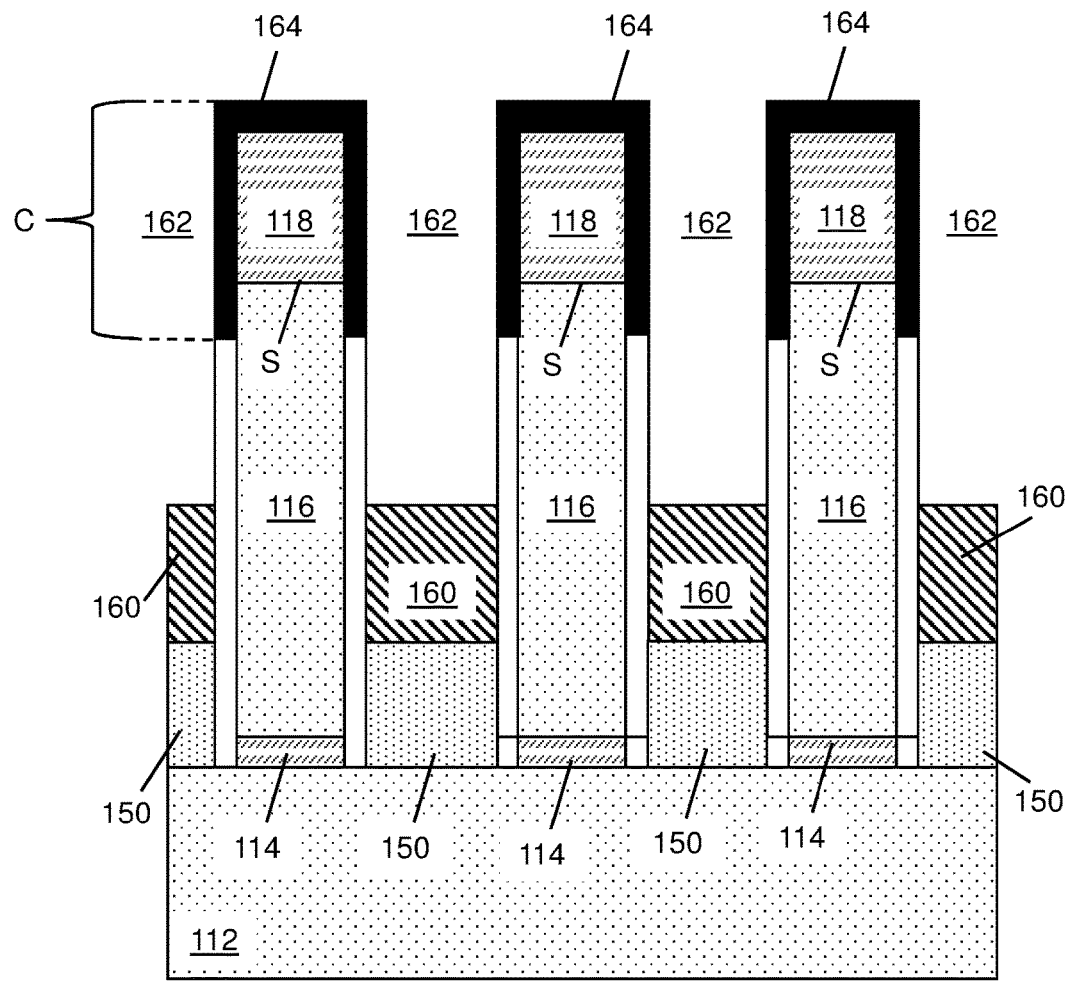
FIG. 15 shows a cross-sectional view of removing the separation layer according to embodiments of the disclosure.

Turning to FIG. 15, the disclosure can include removing separation layer 122 after dopant-implanted region(s) 164 have been formed. According to an example, separation layer 122 can be selectively removed to expose an underlying remainder of insulator 160 thereunder. Separation layer 122 can thus be removed by application of one or more selective etchants for removing an oxide, planarizing layer, and/or other materials included in the composition of separation layer 122. In alternative embodiments, separation layer 122 can be removed with a non-selective etchant, which may cause insulator 160 or portions thereof to also be removed. The greater etch resistivity of dopant-implanted regions 164 relative to spacer material 120 can protect some portions of spacer material 120, as well as gate structure 116 and mask 118, from being etched or modified when non-selective etchants are used.

Figure 16:
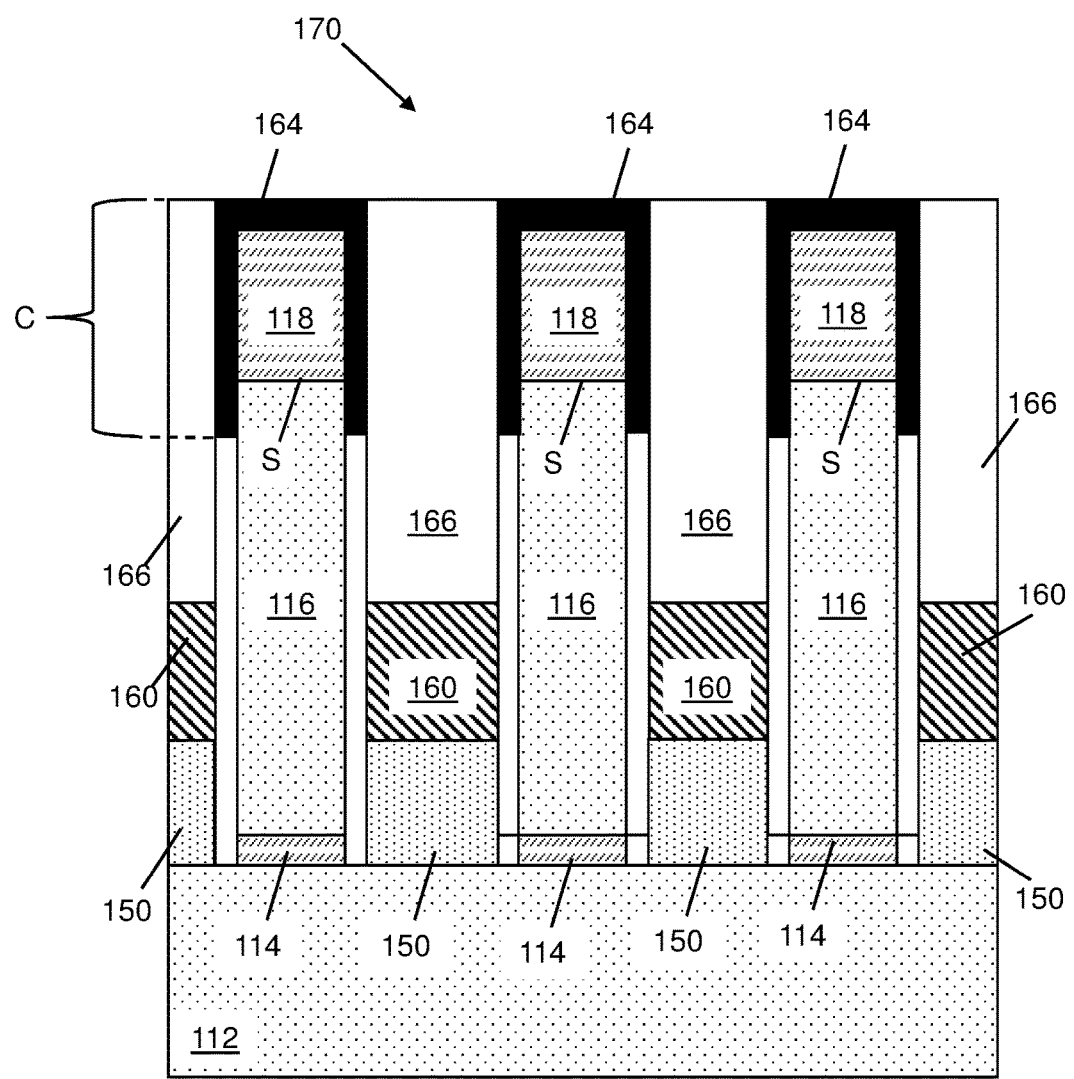
FIG. 16 shows a cross-sectional view of forming a high density plasma (HDP) deposited layer according to embodiments of the disclosure.

Turning to FIG. 16, the circuit elements described herein can be prepared for further processing, e.g., formation of further insulating materials and/or overlying elements such as transistor contacts. For example, openings 162 (FIGS. 12-15) can be filled with one or more layers of insulating material by forming a high density plasma (HDP) deposited layer 166 over (i.e., on or above) substrate 112 and/or source/drain regions 150, e.g., with insulator 160 and/or portions of spacer material 120 being interposed therebetween. HDP deposition generally refers to deposition by way of plasma material having a high concentration of free electrons, and hence, a high concentration of ionic material. HDP deposition can be embodied as a process in which multiple layers of material are deposited and thereafter etched (e.g. by one or more selective etchants which remove oxide compounds), and which causes thin layers of oxide to be deposited and thereafter etched back for other materials to be formed thereon. Materials formed by HDP deposition may be advantageous to materials formed by other techniques, e.g., by being operable to preserve the material composition of spacer material 120 and dopant-implanted regions 164 discussed relative to other processes. HDP layer 166 may generally include one or more insulator materials described elsewhere herein (e.g., relative to insulator 160) capable of being formed by way of HDP deposition. HDP layer 166 may be suitable for formation on insulator 160, e.g., to fill narrow openings 162 between gate structures 116. Although HDP layers 166 may pose a risk of damaging spacer material 120 in conventional fabrication techniques, e.g., due to the repeated deposition and etching, dopant-implanted regions 164 can reduce or prevent such risks. The presence of dopant-implanted regions 164 on upper surfaces of gate structures 116 can protect underlying spacer material 120 from being damaged or degraded during the formation of HDP layer 166. As an example, the presence of nitrogen, carbon, aluminum, silicon nitride (SiN), and/or other materials resistant to selective etchants within dopant-implanted regions 164 can protect underlying portions of gate structures 116, masks 118, and/or spacer material 120 from being etched as HDP layer 166 is formed. After being formed, HDP layer 166 can be planarized such that an upper surface of HDP layer 166 is substantially coplanar with an upper surface of dopant-implanted regions 164. In addition, the thickness of HDP layer 166 above underlying layers may be approximately equal to, or greater than, that of dopant-implanted regions 164. Forming HDP layer 166 after forming dopant-implanted regions 164 can yield an IC structure 170 which includes spacer material 120 with dopant-implanted regions 164 therein.

Figure 17:
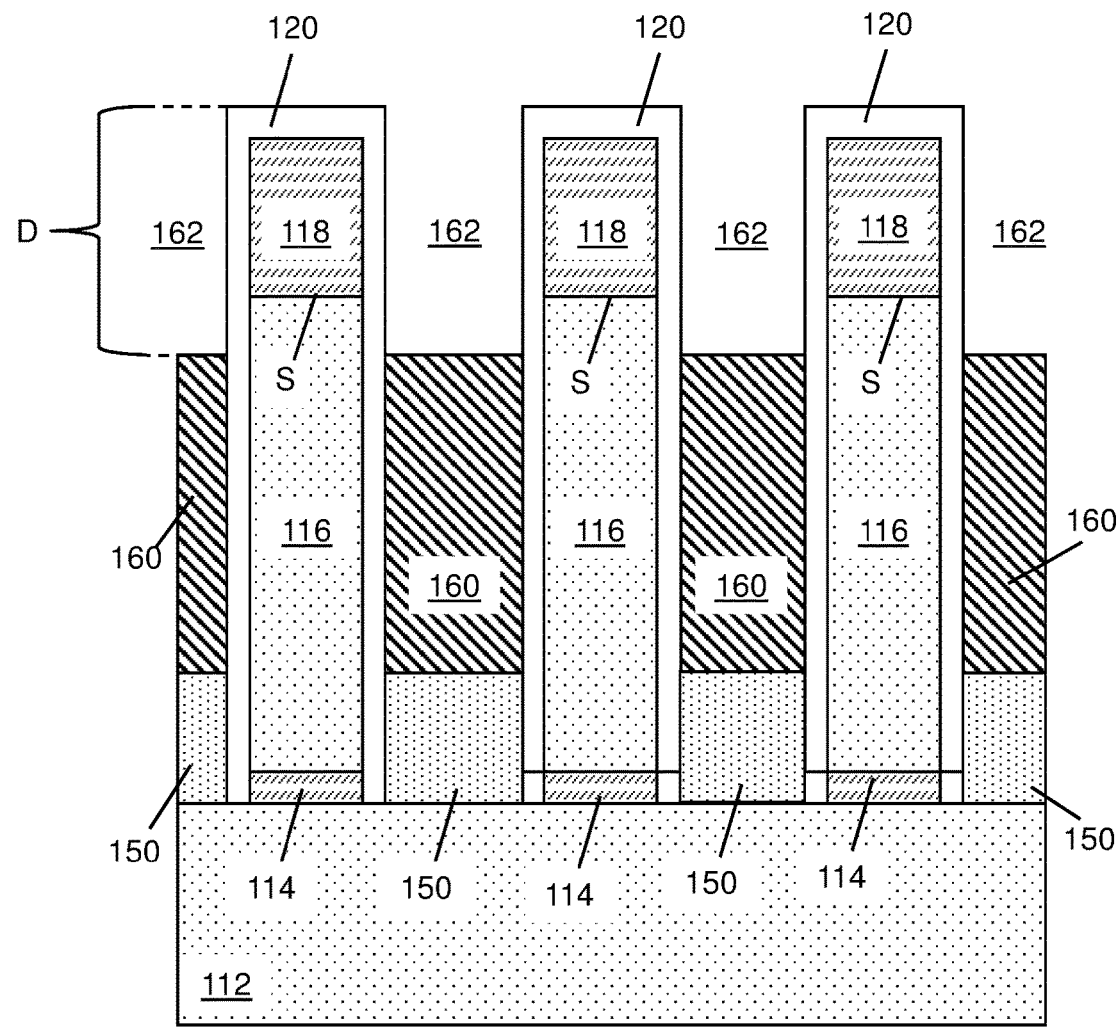
FIG. 17 shows a cross-sectional view of recessing an oxide to expose spacer material to a predetermined depth according to embodiments of the disclosure.
Figure 18:
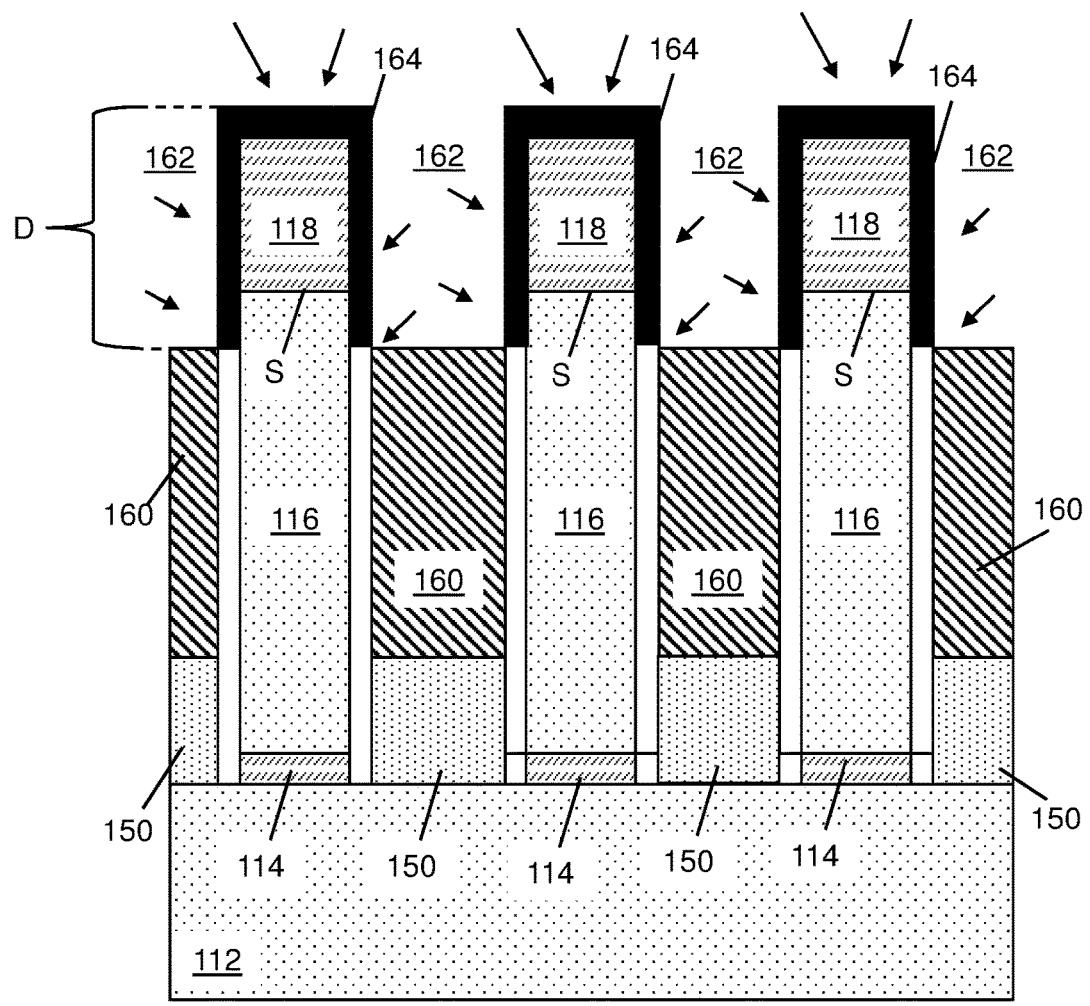
FIG. 18 shows a cross-sectional view of implanting nitrogen into exposed portions of the spacer material according to embodiments of the disclosure.
Figure 19:
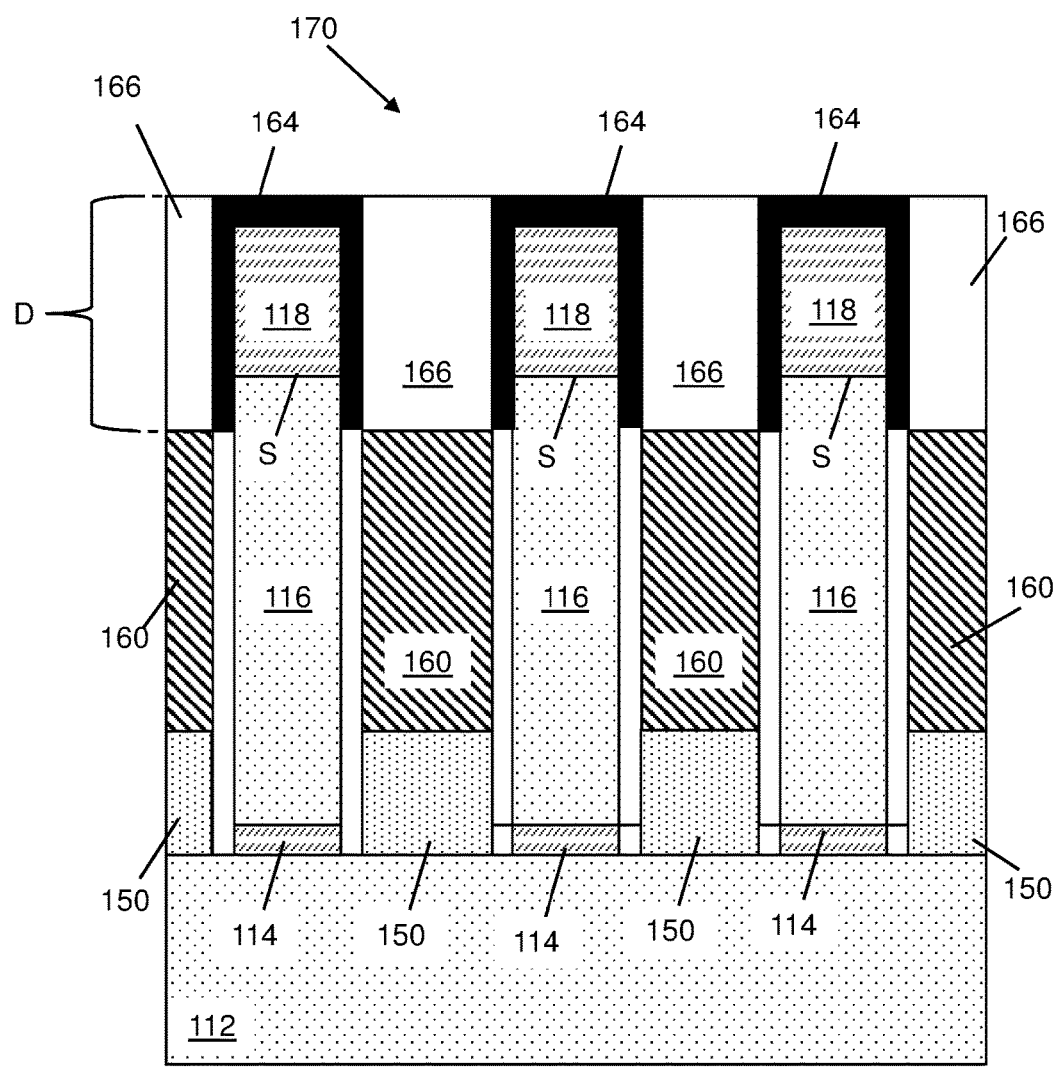
FIG. 19 shows a cross-sectional view of forming a high density plasma (HDP) deposited layer according to embodiments of the disclosure.

Referring to FIGS. 11 and 17 together, the present disclosure can include additional or alternative processing techniques to form dopant-implanted regions 164 in spacer material 120. For example, separation layer 122 (FIGS. 3-4, 8-9, 12-13) can be omitted in some cases to reduce the number of materials formed and removed. In an embodiment, insulator 160 can be removed to a desired depth to form openings 162 between gate structures 116, and to expose a portion D of spacer material 120. The depth to which insulator 160 is removed may be controlled, e.g., by varying the amount of etchant material for removing insulator 160, etching insulator 160 for a predetermined amount of time, etc. Referring briefly to FIG. 18, portion D of spacer material 120 can be implanted with dopants (depicted by arrows in FIG. 18) to yield dopant-implanted regions 164 immediately after removing portions of insulator 160, and without forming separation layer 122 on the remainder of insulator 160 as described herein. Dopant-implanted regions 164 thus can be formed on portion D of spacer material 120 to the depth of openings 162. As shown in FIG. 19, HDP layer 166 can thereafter be formed directly on insulator 160 after forming dopant-implanted regions 164 as discussed elsewhere herein. The processes discussed herein can thereby produce IC structure 170 with spacer material 120 and dopant-implanted regions 164 without forming or removing separation layer 122 as described elsewhere herein.

The method as described above may be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
    forming a gate structure on an upper surface of a substrate, the gate structure including a mask at an upper surface thereof;
    forming a spacer material on the substrate, the mask, and sidewalls of the gate structure;
    forming an oxide material over the substrate and laterally adjacent to the spacer material;
    forming an organic planarization layer (OPL) on the oxide material to a predetermined height, wherein an exposed portion of the spacer material is positioned above an upper surface of the OPL and the oxide material;
    implanting nitrogen ions into the exposed portion of the spacer material to yield a nitrogen-implanted region within the spacer material;
    removing the OPL from the oxide material after forming the nitrogen-implanted region of the spacer material to expose the oxide material; and
    forming an oxide layer over the substrate and laterally adjacent to the nitrogen-implanted region of the spacer material using a high density plasma (HDP) process, the HDP process including deposition and etching of a plurality of precursor oxide layers over the substrate and laterally adjacent to the nitrogen-implanted region of the spacer material, wherein forming the oxide layer includes performing the HDP process to form the precursor oxide layers directly on the oxide material, and wherein the nitrogen-implanted region within the spacer material protects the gate structure from being etched during the HDP process.

2. The method of claim 1, further comprising annealing the nitrogen-implanted region of the spacer material, before forming the oxide layer.

3. The method of claim 1, wherein a height of the mask above an upper surface of the gate structure is greater than a height of the gate structure above an upper surface of the substrate.

4. A method of forming an integrated circuit (IC) structure, the method comprising:
    forming a gate structure on an upper surface of a substrate, the gate structure including a mask at an upper surface thereof;
    forming a spacer material on the substrate, the mask, and sidewalls of the gate structure;
    forming a first oxide layer over the substrate and laterally adjacent to the spacer material;
    removing a portion of the first oxide layer, wherein a height of a remaining portion of the first oxide layer has a predetermined height, thereby an exposed portion of the spacer material is positioned above an upper surface of the first oxide layer;
    implanting nitrogen ions into the exposed portion of the spacer material to yield a nitrogen-implanted region within the spacer material; and
    forming a second oxide layer over the first oxide layer and laterally adjacent to the nitrogen-implanted region of the spacer material using a high density plasma (HDP) process, the HDP process including deposition and etching of a plurality of precursor oxide layers over the substrate and laterally adjacent to the nitrogen-implanted region of the spacer material, wherein the nitrogen-implanted region within the spacer material protects the gate structure from being etched during the HDP process.

5. The method of claim 4, further comprising annealing the nitrogen-implanted region of the spacer material, before forming the second oxide layer.

6. The method of claim 4, wherein a height of the mask above an upper surface of the gate structure is greater than a height of the gate structure above an upper surface of the substrate.

7. The method of claim 4, wherein forming the first oxide layer to the predetermined height includes:
    depositing an oxide material over the gate structure and the spacer material; and
    removing a portion of the oxide material such that a remaining portion of the oxide material over the substrate forms the first oxide layer having the predetermined height above the substrate.

8. The method of claim 4, wherein the etching of the plurality of precursor oxide layers during the HDP process includes applying etchant configured to selectively dissolve oxide materials.

9. The method of claim 4, wherein forming the first oxide layer covers a source/drain semiconductor region positioned on the substrate.

10. The method of claim 4, wherein the mask comprises silicon nitride, and wherein the spacer material comprises an oxide insulator.

11. A method of forming an integrated circuit (IC) structure, the method comprising:
    forming a gate structure on a semiconductor fin, the gate structure including a mask at an upper surface thereof;
    forming a spacer material on the semiconductor fin, the mask, and sidewalls of the gate structure;

forming a first oxide layer over the semiconductor fin and laterally adjacent to a portion of the spacer material;

forming an organic planarization layer (OPL) on an upper surface of the first oxide layer, such that an exposed remainder of the spacer material is positioned above an upper surface of the OPL;

forming a nitrogen-implanted region within the spacer material by implanting nitrogen ions into the exposed remainder of the spacer material;

removing the OPL after forming the nitrogen-implanted region within the spacer material; and forming a second oxide layer on the first oxide layer and laterally adjacent to the nitrogen-implanted region of the spacer material using a high density plasma (HDP) process, the HDP process including a deposition and etching of a plurality of precursor oxide layers over the first oxide layer and laterally adjacent to the nitrogen-implanted region of the spacer material, wherein the nitrogen-implanted region within the spacer material protects the gate structure from being etched during the HDP process.

12. The method of claim 11, further comprising annealing the nitrogen-implanted region of the spacer material, before forming the second oxide layer.

13. The method of claim 11, wherein a height of the mask above an upper surface of the gate structure is greater than a height of the gate structure above an upper surface of the semiconductor fin.

14. The method of claim 11, wherein forming the first oxide layer covers a source/drain region of the semiconductor fin.

15. The method of claim 11, wherein the mask comprises silicon nitride, and wherein the spacer material comprises an oxide insulator.

16. The method of claim 11, wherein the etching of the plurality of precursor oxide layers during the HDP process includes applying an etchant configured to selectively dissolve oxide materials.

* * * * *